(12) United States Patent
Soundara Pandian et al.

(10) Patent No.: US 9,091,928 B2
(45) Date of Patent: Jul. 28, 2015

(54) METHOD FOR MANUFACTURING A PLANARISED REFLECTIVE LAYER FOR MICROMIRROR DEVICES

(71) Applicant: Silterra Malaysia Sdn. Bhd., Kulim, Kedah (MY)

(72) Inventors: Mohanraj Soundara Pandian, Kedah (MY); Wee Song Tay, Kedah (MY); Muniandy Shunmugam, Kedah (MY); Venkatesh Madhaven, Kedah (MY); Arjun Kumar Kantimahanti, Kedah (MY)

(73) Assignee: Silterra Malaysia Sdn. Bhd., Kulim (MY)

( * ) Notice: Subject to any disclaimer, the term of this patent is extended or adjusted under 35 U.S.C. 154(b) by 115 days.

(21) Appl. No.: 13/730,768

(22) Filed: Dec. 28, 2012

(65) Prior Publication Data

US 2013/0171573 A1    Jul. 4, 2013

(30) Foreign Application Priority Data

Dec. 30, 2011    (MY) .......................... PI 2011700210

(51) Int. Cl.
  *G03F 7/26*    (2006.01)
  *G03F 7/20*    (2006.01)
  *G02B 5/08*    (2006.01)
  *G02B 26/08*   (2006.01)

(52) U.S. Cl.
  CPC ............ *G03F 7/2022* (2013.01); *G02B 5/0808* (2013.01); *G02B 26/0833* (2013.01)

(58) Field of Classification Search
  CPC ............ B81C 1/00476; B81C 1/00523; B81C 2201/0104; B81C 2201/013
  USPC ......................................... 430/311, 314, 315
  See application file for complete search history.

(56) References Cited

U.S. PATENT DOCUMENTS

2005/0045276 A1 *    3/2005  Patel et al. ................ 156/345.43

* cited by examiner

*Primary Examiner* — Kathleen Duda
(74) *Attorney, Agent, or Firm* — Christensen O'Connor Johnson Kindness PLLC

(57) ABSTRACT

A method for manufacturing a planarized reflective layer disposed on a hinge layer connected to a hinge support post (210) is disclosed. The method comprises depositing a first layer of a first material to form the hinge layer (206), patterning a first mask over the first layer and selectively removing the first material not covered by any of the first mask to form a plurality of recesses, depositing a second layer of a second material over the first layer, patterning a second mask over the second layer and selectively removing the second material not covered by any of the second mask to form a hinge component (212), depositing a reflective layer (202) of a reflective material over the second layer and planarizing the reflective layer (202) to form a substantially planar reflective surface.

7 Claims, 2 Drawing Sheets

METHOD FOR MANUFACTURING A PLANARISED REFLECTIVE LAYER FOR MICROMIRROR DEVICES

CROSS-REFERENCE TO RELATED APPLICATION

This application is based upon and claims the benefit of priority from Malaysian Application No. PI 2011700210, filed Dec. 30, 2011, the entire disclosure of which is hereby incorporated by reference herein.

BACKGROUND

The present invention relates generally to a method of manufacturing a planarised reflective layer for micromirror devices. Micromirror devices require a substantially planarised reflective layer to minimize optical loss due to topography interference. Therefore, fabricating a substantially planarised reflective layer is absolutely crucial. However, the method of manufacturing the same according to conventional methods are complex as it requires various deposition, masking and etching steps. FIG. 1 is a cross-sectional view of a micromirror device comprising a reflective layer manufactured according to conventional methods. According to the conventional methods, an intermediary layer, normally amorphous-Silicon (104), is deposited and planarised prior to depositing an aluminium reflective layer (102). This results in a complex micromirror structure as well as a complex method of manufacturing the same.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The present invention provides a method for manufacturing a planarised reflective layer for micromirror devices, more particularly directly depositing a reflective layer on a hinge layer and thereafter planarising the reflective layer using Chemical Mechanical Planarization/Polishing (CMP). The present invention proposes to reduce manufacturing cost, improve manufacturing yield and reduce interfacial stress on the reflective layer.

One aspect of the present invention is a method for manufacturing a planarised reflective layer disposed on a hinge layer connected to a hinge support post. The method comprises depositing a first layer of a first material to form the hinge layer, patterning a first mask over the first layer and selectively removing the first material not covered by any of the first mask to form a plurality of recesses, depositing a second layer of a second material over the first layer, patterning a second mask over the second layer and selectively removing the second material not covered by any of the second mask to form a hinge component, depositing a reflective layer of a reflective material over the second layer and planarising the reflective layer to form a substantially planar reflective surface.

In one embodiment of the present invention, the method further comprises patterning a third mask over the reflective layer and selectively removing the reflective material not covered by any of the third mask to form a micromirror structure. The step of planarising the reflective layer to form a substantially planar reflective surface comprises performing Chemical Mechanical Planarising/Polishing (CMP) on the reflective layer to form the substantially planar reflective surface. The first material comprises a conductive material such as titanium aluminium nitride, aluminium, titanium nitride or doped amorphous silicon, the second material comprises a photoresist material and the reflective material comprises aluminium. The plurality of recesses are disposed above the hinge support post.

The present invention consists of features and a combination of parts hereinafter fully described and illustrated in the accompanying drawings, it being understood that various changes in the details may be made without departing from the scope of the invention or sacrificing any of the advantages of the present invention.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The present invention relates to a method for manufacturing a planarised reflective layer for micromirror devices. Hereinafter, this specification will describe the present invention according to the preferred embodiments of the present invention. However, it is to be understood that limiting the description to the preferred embodiments of the invention is merely to facilitate discussion of the present invention and it is envisioned that those skilled in the art may devise various modifications and equivalents without departing from the scope of the appended claims.

The method for manufacturing the planarised reflective layer for micromirror devices according to the present invention proposes to reduce manufacturing cost, improve manufacturing yield and reduce interfacial stress on a reflective layer of the micromirror device. This is achieved by directly depositing a reflective layer on a topography-hinge layer and thereafter planarising the reflective layer using Chemical Mechanical Planarization/Polishing (CMP).

Figure 1:
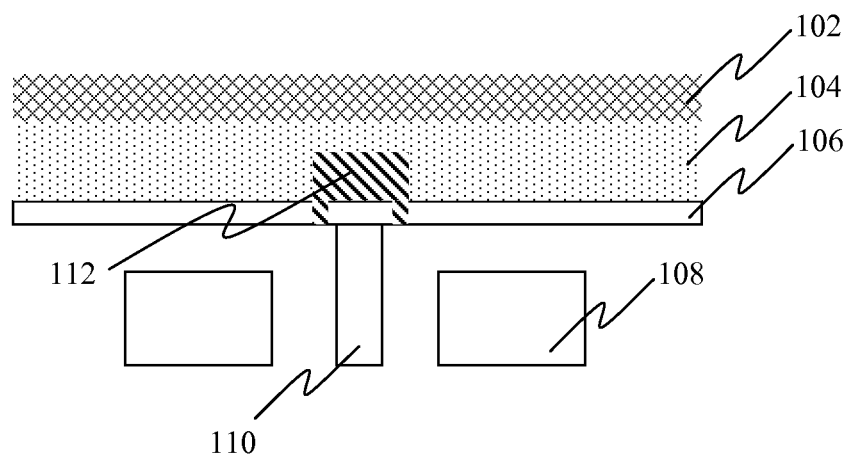
FIG. 1 is a cross-sectional view of a micromirror device comprising a reflective layer manufactured according to conventional methods.
Figure 2:
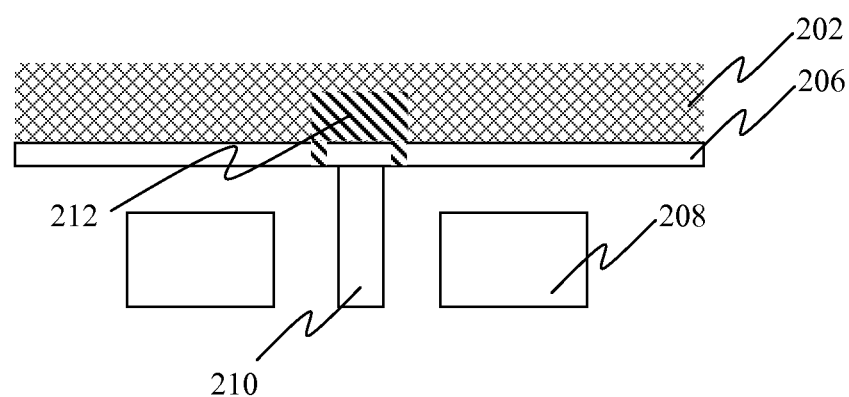
FIG. 2 is a cross-sectional view of a micromirror device comprising a reflective layer manufactured according to the embodiments of the present invention.

Reference is being made to FIG. 2. FIG. 2 is a cross-sectional view of a micromirror device comprising a reflective layer manufactured according to the embodiments of the present invention. The micromirror device comprises a hinge support post 210, electrodes 208, a hinge and a micromirror structure. The hinge support post 210 and the electrodes 208 are disposed on a CMOS substrate (not shown). The hinge support post 210 supports the hinge and micromirror structure while the electrodes 208 control the tilting of the hinge. The hinge is a mechanical movable structure that further comprises a topography-hinge layer 206 and a hinge component 212 while the micromirror structure comprises a reflective layer 202. The hinge layer 206 is disposed on the hinge support post 210 and the hinge component 212 is disposed directly above the hinge support post 210. The embodiments of the present invention are focused on the fabrication of the planarised reflective layer of the micromirror structure and the other components are not discussed at length.

Reference is now being made to FIGS. 3A-3F. FIGS. 3A-3F are cross sectional views illustrating the method of manufacturing the planarised reflective layer for micromirror devices according to the embodiments of the present invention.

Figure 3A:
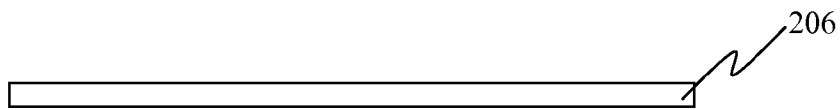
FIGS. 3A-3F are cross-sectional views illustrating the method of manufacturing the planarised reflective layer for micromirror devices according to the embodiments of the present invention.
Figure 3B:

The method for manufacturing the planarised reflective layer disposed on the hinge layer 206 comprises depositing a first layer of a first material to form the hinge layer 206 as shown in FIG. 3A. The first material comprises a conductive material such as titanium aluminium nitride (TiAlN), aluminium, titanium nitride or doped amorphous silicon. Referring to FIG. 3B, the conductive layer is then patterned by a first mask and selectively removed or etched to form the hinge layer 206 with a plurality of recesses. The plurality of recesses are disposed directly above the hinge support post 210.

Figure 3C:
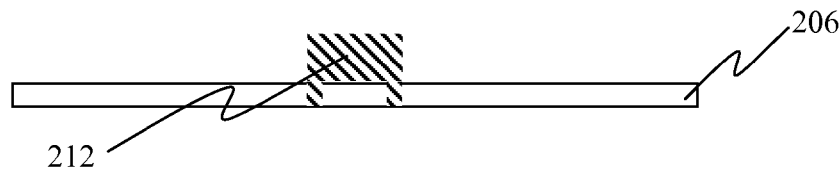

Thereafter, a second layer of a second material is deposited over the hinge layer 206. The second material comprises a photoresist material. The photoresist layer is patterned by a second mask and selectively removed or etched to form a hinge component 212 as shown in FIG. 3C.

Figure 3D:
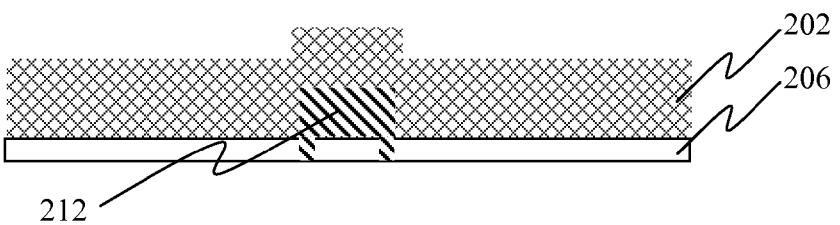
Figure 3E:
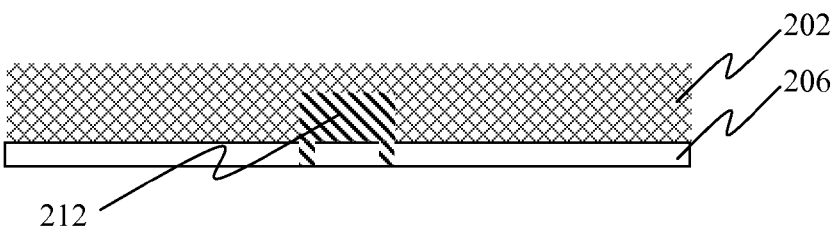

FIG. 3D illustrates a deposition of a reflective layer 202 of a reflective material over the photoresist layer. The reflective material comprises aluminium (Al) due to its CMOS compatibility and high reflectance factor. Finally, the reflective layer 202 is directly planarised to form a substantially planar reflective surface as shown in FIG. 3E. The reflective layer 202 is directly planarised through Chemical Mechanical Planarising/Polishing (CMP).

Figure 3F:
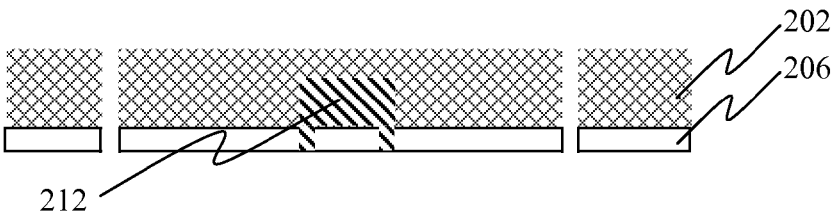

In one embodiment of the present invention, the method for manufacturing the planarised reflective layer further comprises patterning a third mask over the reflective layer 202 and selectively removing or etching the reflective material not covered by any of the third mask to form a micromirror structure as shown in FIG. 3F.

Since the present invention comprises directly planarising the reflective layer 202, there is no requirement for amorphous Silicon spacers as in conventional fabrication methods. This reduces manufacturing cost, improves manufacturing yield and reduces interfacial stress on the reflective layer 202 of the micromirror device.

While illustrative embodiments have been illustrated and described, it will be appreciated that various changes can be made therein without departing from the spirit and scope of the invention.

The embodiments of the invention in which an exclusive property or privilege is claimed are defined as follows:

1. A method for manufacturing a planarised reflective layer disposed on a hinge layer connected to a hinge support post (210), the method comprises:
   depositing a first layer of a first material to form the hinge layer (206);
   patterning a first mask over the first layer and selectively removing the first material not covered by any of the first mask to form a plurality of recesses;
   depositing a second layer of a second material over the first layer;
   patterning a second mask over the second layer and selectively removing the second material not covered by any of the second mask to form a hinge component (212), wherein the hinge component extends above the hinge layer and extends into the plurality of recesses;
   depositing a reflective layer (202) of a reflective material over the hinge layer and the upwardly extending hinge component such that the deposited reflective layer is not planar; and
   planarising the reflective layer (202) to form a substantially planar reflective surface.

2. A method for manufacturing a planarised reflective layer according to claim 1, wherein the method further comprises patterning a third mask over the reflective layer (202) and selectively removing the reflective material not covered by any of the third mask to form a micromirror structure.

3. A method for manufacturing a planarised reflective layer according to claim 1, wherein the first material comprises a conductive material such as titanium aluminium nitride, aluminium, titanium nitride or doped amorphous silicon.

4. A method for manufacturing a planarised reflective layer according to claim 1, wherein the second material comprises a photoresist material.

5. A method for manufacturing a planarised reflective layer according to claim 1, wherein the reflective material comprises aluminium.

6. A method for manufacturing a planarised reflective layer according to claim 1, wherein the plurality of recesses are disposed above the hinge support post (210).

7. A method for manufacturing a planarised reflective layer according to claim 1, wherein planarising the reflective layer (202) to form a substantially planar reflective surface comprises performing Chemical Mechanical Planarising/Polishing (CMP) on the reflective layer (202) to form the substantially planar reflective surface.

* * * * *